(12) United States Patent
Baniecki et al.

(10) Patent No.: US 6,975,501 B1
(45) Date of Patent: Dec. 13, 2005

(54) ELECTRONIC DEVICE AND METHOD OF APPLYING VOLTAGE TO CAPACITOR

(75) Inventors: John David Baniecki, Kawasaki (JP); Takeshi Shioga, Kawasaki (JP); Kazuaki Kurihara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/012,211

(22) Filed: Dec. 16, 2004

(30) Foreign Application Priority Data

Aug. 11, 2004 (JP) .............................. 2004-234672

(51) Int. Cl.[7] .............................. H01G 4/06; H01G 2/12
(52) U.S. Cl. .................. 361/311; 361/15; 361/306.1; 257/295
(58) Field of Search ................ 361/311–313, 306.1, 361/115, 15, 18, 303; 320/166, 160; 363/15–21

(56) References Cited

U.S. PATENT DOCUMENTS

| 5,822,199 A | * | 10/1998 | Jacobs et al. | ................ | 363/20 |
| 5,889,299 A | * | 3/1999 | Abe et al. | .................. | 257/295 |
| 6,456,477 B1 | * | 9/2002 | McIntosh et al. | ............ | 361/115 |
| 6,548,988 B2 | * | 4/2003 | Duff, Jr. | ..................... | 320/160 |

FOREIGN PATENT DOCUMENTS

| JP | 10-93050 | 4/1998 |
| JP | 2004-88892 | 3/2004 |

\* cited by examiner

*Primary Examiner*—Anthony Dinkins
(74) *Attorney, Agent, or Firm*—Westerman, Hattori, Daniels & Adrian, LLP

(57) ABSTRACT

An electronic device comprises a silicon substrate (base material), an underlying insulating film formed on the silicon substrate, a capacitor constructed by forming a bottom electrode, a capacitor dielectric film, and a top electrode sequentially on the underlying insulating film, and a voltage supply circuit for supplying a voltage with a bipolar waveform to at least one of the bottom electrode and the top electrode, wherein an amplitude of the voltage is set to $5 \times 10^5$ d (V) or less (d: an interval (cm) between the top electrode and the bottom electrode). Accordingly, an electronic device and a method of applying a voltage to a capacitor, capable of prolonging a lifetime of a capacitor by preventing degradation of a capacitor dielectric film are provided.

27 Claims, 11 Drawing Sheets

ELECTRONIC DEVICE AND METHOD OF APPLYING VOLTAGE TO CAPACITOR

CROSS-REFERENCE TO RELATED APPLICATIONS

This application is based on and claims priority of Japanese Patent Application No. 2004-234672 filed on Aug. 11, 2004, the entire contents of which are incorporated herein by reference.

BACKGROUND OF THE INVENTION

1. Field of the Invention

The present invention relates to an electronic device and a method of applying a voltage to a capacitor.

2. Description of the Related Art $ABO_3$ perovskite type dielectric materials such as BST ($(Ba,Sr)TiO_3$), and the like are currently being investigated widely as applications for the capacitor dielectric film in the decoupling capacitor, DRAM (Dynamic Random Access Memory), and so on. Also, $ABO_3$ perovskite type dielectric materials with the ferroelectric characteristic are currently being investigated as the capacitor dielectric film in the nonvolatile memories such as FeRAM (Ferroelectric Random Access Memory), and so on.

DC voltage is usually applied to the dielectric film, which is used in such element, for a considerable long time in practical use.

Technologies relevant to the present invention are disclosed in Patent Literatures 1, 2.

[Patent Literature 1] Patent Application Publication (KOKAI) Hei 10-93050
[Patent Literature 2] Patent Application Publication (KOKAI) 2004-88892

When the capacitor dielectric film is exposed to the electric field for a long time in this manner, such a problem is caused that the reliability of the capacitor is lowered. It is known that, when the capacitor dielectric film made of high-dielectric material or ferroelectric material is subjected to an electrical stress, the film is degraded due to movement of electrons or ions in the film. As the mechanism of such degradation, resistance degradation, TDDB (Time Dependent Dielectric Breakdown), etc. have been reported.

If the capacitor dielectric film is degraded in this manner, a leakage current exceeding an allowable value is generated between the top electrode and the bottom electrode constituting the capacitor and then the lifetime of the capacitor is shortened. Therefore, an electronic device that is capable of enhancing the lifetime of the capacitor by preventing degradation of the capacitor dielectric film is required.

SUMMARY OF THE INVENTION

According to one aspect of the present invention, there is provided an electronic device that comprises a base material; an insulating film formed on the base material; a capacitor constructed by forming a bottom electrode, a capacitor dielectric film, and a top electrode sequentially on the insulating film; and a voltage supply circuit for supplying a voltage with a bipolar waveform to at least one of the bottom electrode and the top electrode; wherein an amplitude of the voltage is set to $5 \times 10^5$ d (V) or less (d: an interval (cm) between the top electrode and the bottom electrode).

According to another aspect of the present invention, there is provided a method of applying a voltage to a capacitor comprising: applying a voltage having a bipolar waveform and an amplitude of $5 \times 10^5$ d (V) or less (d: an interval (cm) between a top electrode and a bottom electrode) to at least one of the bottom electrode and the top electrode constituting a capacitor.

Experimental results obtained by the inventors shows that the resistance degradation is seldom induced in the capacitor dielectric film when the voltage with the bipolar waveform is applied to the capacitor. Therefore, according to the present invention, the resistance degradation of the capacitor dielectric film can be suppressed and also the enhanced lifetime of the capacitor can be promoted.

It should be noted that the resistance degradation might be induced if the amplitude of the voltage is made excessively large. As such, it is preferable that the amplitude of the voltage be set lower than $5 \times 10^5$ d (V) or less (d: an interval (cm) between the top electrode and the bottom electrode).

Also, unless the offset of the bipolar voltage is 0, the ions, etc. in the capacitor dielectric film are drifted in one direction corresponding to the offset, and thus the resistance degradation might be induced. Therefore, it is preferable to set the offset to 0.

In addition, the resistance degradation might also be induced if the frequency of the voltage is excessively high. Therefore, it is preferable that the frequency be set lower than 100 kHz.

Similarly, if a time period in which the positive electric potential is applied and a time period in which the negative electric potential is applied are largely different, the ions, etc. in the capacitor dielectric film are attracted toward only one electrode and thus the resistance degradation might be caused. Therefore, it is preferable that a percentage $T_D$ of a duty cycle of the voltage be set to $30\% < T_D < 70\%$.

A square wave, a triangular wave, and a sinusoidal wave are used as the bipolar waveform, for example.

Also, it is preferable that the decoupling capacitor for the power-supply line used to supply the voltage to the semiconductor element, or the like be employed as the above capacitor.

DESCRIPTION OF THE PREFERRED EMBODIMENTS

The best mode for carrying out the present invention will be explained in detail with reference to the accompanying drawings hereinafter.

(1) First Embodiment

FIGS. 1A to 1E are sectional views showing a capacitor used in a first embodiment of the present invention in the middle of manufacture.

Figure 1A:
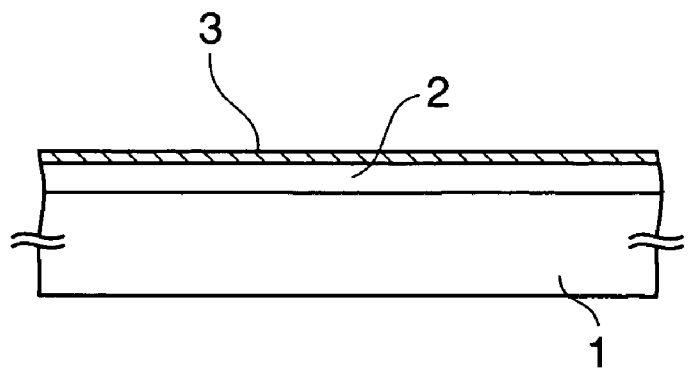
FIGS. 1A to 1E are sectional views showing a capacitor used in a first embodiment of the present invention in the middle of manufacture.

At first, steps required until a sectional structure shown in FIG. 1A is obtained will be explained hereunder.

First, a silicon oxide ($SiO_2$) film of about 500 nm thickness is formed as an underlying insulating film 2 on a base material 1 such as a silicon substrate, or the like by the CVD (Chemical Vapor Deposition) method. Here, the base material 1 is not limited to the silicon substrate, and a semiconductor substrate made of any one of single crystals of silicon, germanium, silicon germanium (SiGe), gallium arsenide (GaAs), indium arsenide (InAs), and indium phosphorus (InP) may be employed as the base material 1. Also, the underlying insulating film 2 is not limited to the silicon oxide film. Any one of a silicon oxide film, a silicon nitride ($Si_3N_4$) film, a silicon oxide nitride (SiON) film, a high-dielectric metal oxide film, and a xerogel film or a composite film formed of a combination of two or more of these films may be formed as the underlying insulating film 2.

Then, a titanium oxide ($TiO_2$) of about 20 nm thickness is formed as an adhesion layer 3 by the sputter method. This adhesion layer 3 is not limited to the titanium oxide. For example, any one of platinum, iridium, zirconium, titanium, titanium oxide, iridium oxide, platinum oxide, zirconium oxide, titanium oxide, titanium aluminum nitride (TiAlN), tantalum nitride, and tantalum silicon nitride (TaSiN) or a single layer film or a multi-layered film composed of their alloys may be employed as the adhesion layer 3.

Figure 1B:
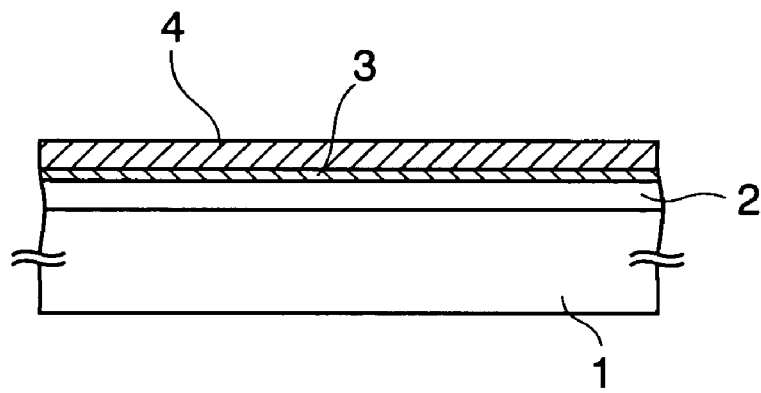

Then, as shown in FIG. 1B, a platinum (Pt) film of about 80 nm thickness is formed as a first conductive film 4 by the RF sputter method. The first conductive film 4 never causes a film peeling in the middle of manufacture because adhesion strength to the base material 1 is improved by the adhesion layer 3. Also, the first conductive film 4 is not limited to the platinum film. The first conductive film 4 may be formed of any one of platinum, palladium, iridium, ruthenium, rhodium, osmium, gold, silver, copper, platinum oxide, iridium oxide, and ruthenium oxide or a single layer film or a multi-layered film composed of their alloys.

Figure 1C:
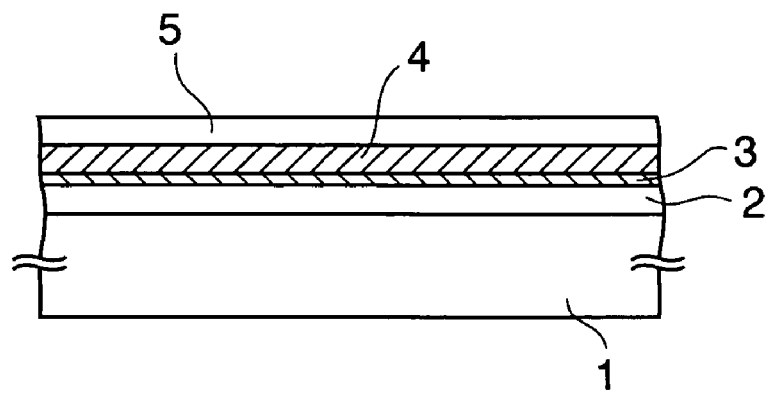

Next, steps required until a sectional structure shown in FIG. 1C is obtained will be explained hereunder.

First, the base material 1 is loaded on a stage in a sputter chamber (not shown) for the RF sputtering, in which a sputter target made of BST (($Ba,Sr)TiO_3$) sintering body is provided. Then, a substrate temperature is stabilized at about 550° C. Then, $O_2$ and Ar a flow rate of which is 30:3.7 are introduced as the sputter gas into the chamber. Then, BST sputtering is started by applying the RF (high frequency) power, whose frequency is 13.56 MHz and whose power is 100 W, between the stage and the target when a pressure in the chamber is stabilized at about 10 mTorr. Then, this condition is maintained for a predetermined time. Then, the sputtering is stopped when a BST film of about 100 nm thickness is formed on the first conductive film 4. The resultant film gives a dielectric film 5.

In this case, the dielectric material constituting the dielectric film 5 is not limited to BST. The dielectric film 5 may be formed of either titanium-based $ABO_3$ perovskite type dielectric material or dielectric material with a pyrochlore structure, which is represented by the general formula $A_2B_2O_7$. As the perovskite type dielectric material, there are $BaTiO_3$, $SrTiO_3$, $PbTiO_3$, and $(Pb,La)(Zr,Ti)O_3$ in addition to BST. Also, there is $Pb_2Ti_2O_7$ as the dielectric material with the pyrochlore structure.

Then, in order to enhance the crystallinity of the dielectric film 5, this dielectric film 5 is annealed at the substrate temperature of 100 to 900° C. in the oxygen-containing atmosphere.

Figure 1D:
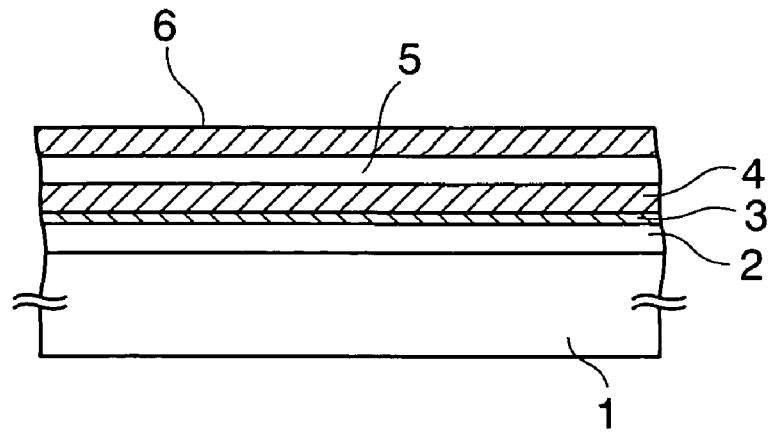

Then, as shown in FIG. 1D, a platinum film of about 80 nm thickness is formed as a second conductive film 6 by the RF sputter method. Here, the second conductive film 6 is not limited to the platinum film. As the film that can constitute the second conductive film 6, any one of platinum, palladium, iridium, ruthenium, rhodium, osmium, gold, silver, copper, platinum oxide, iridium oxide, ruthenium oxide, strontium ruthenium oxide ($SrRuO_3$), and lanthanum nickel oxide ($LaNiO_3$) or a single layer film or a multi-layered film composed of their alloys may be employed.

Figure 1E:
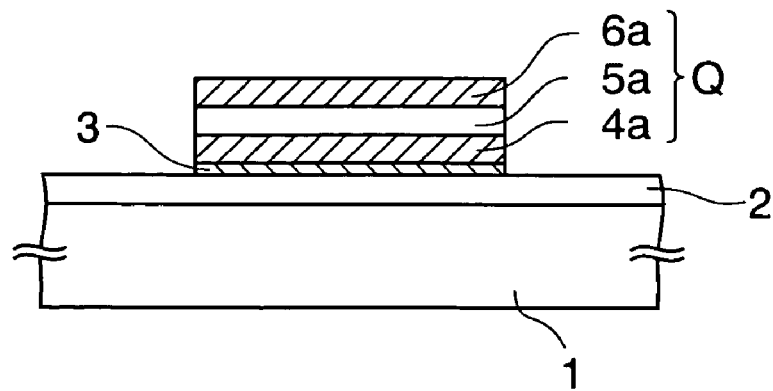

Then, as shown in FIG. 1E, the first conductive film 4, the dielectric film 5, and the second conductive film 6 are patterned by the photolithography. Thus, a capacitor Q is constructed by a bottom electrode 4a, a capacitor dielectric film 5a, and a top electrode 6a. The adhesion layer 3 is also patterned by this photolithography and is left only under the bottom electrode 4a. In this event, the patterning sequence of respective films 4 to 6 are not particularly restricted. Respective films 4 to 6 may be etched collectively by using a sheet of resist pattern, or may be etched separately every film by using different resist patterns.

The inventors of this application investigated how the capacitor dielectric film 5a of the capacitor Q manufactured as above is degraded according to the applied voltage. Examined results are shown in FIG. 2.

In this examination, three types (1.5 V, 5 V, 10 V) of DC voltages were applied between the top electrode 6a and the bottom electrode 4a, and a relationship between a time lapsed (sec) after the voltage is applied and a leakage current ($A/cm^2$) was examined at respective voltages respectively.

Figure 2:
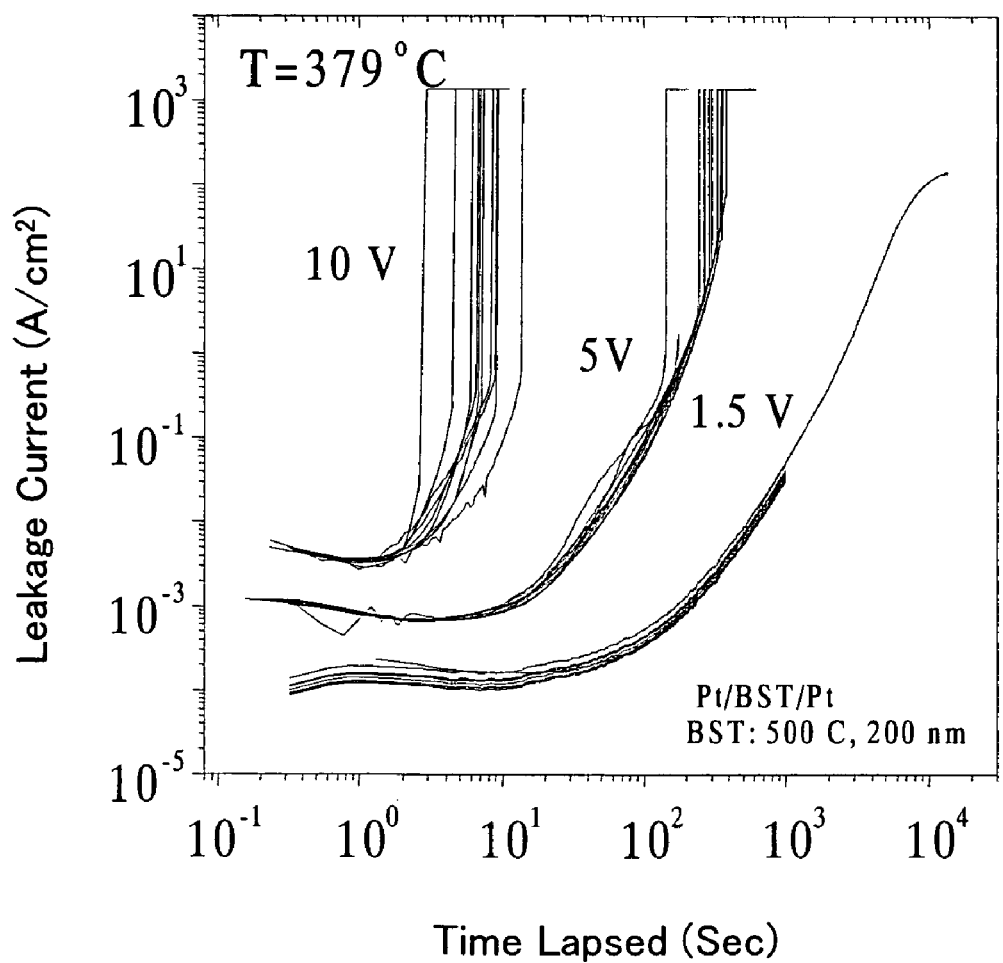
FIG. 2 is a graph showing of examined results indicating how a capacitor dielectric film of a capacitor used in the first embodiment of the present invention is degraded according to an applied voltage.

As shown in FIG. 2, in the case where an applied voltage is set to 1.5 V, the leakage current is suppressed for a while after the application of voltage is started. But the leakage current is increased with the lapse of time, and then the hard breakdown is generated in the capacitor dielectric film 5a. Also, in the case where the applied voltage is set to 10 V, the leakage current is increased abruptly in a short time after the application of voltage is started, and then the hard breakdown is also generated. In this manner, a phenomenon that the leakage current is increased with the lapse of time to lead to the hard breakdown is called resistance degradation of the capacitor dielectric film 5a.

It is understood based on these results that, if the application of the DC voltage to the capacitor Q is continued, the resistance degradation is caused in the capacitor dielectric film 5a and thus the lifetime of the capacitor Q is shortened.

Therefore, the inventors of this application investigated how the leakage current of the capacitor Q is changed from the case where the DC voltage is applied, while applying a time-varying voltage to the capacitor Q instead of the DC voltage.

Figure 3:
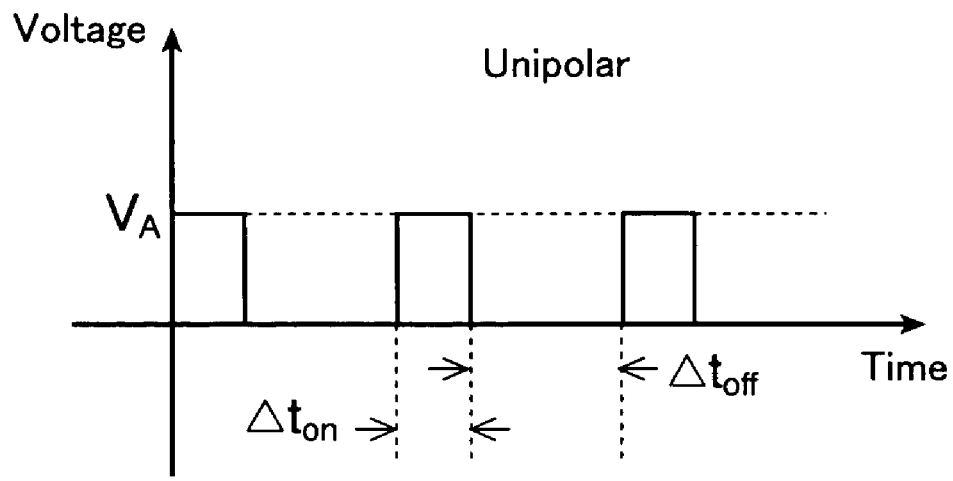
FIG. 3 is a scheme showing a unipolar square wave in the first embodiment of the present invention.
Figure 4:
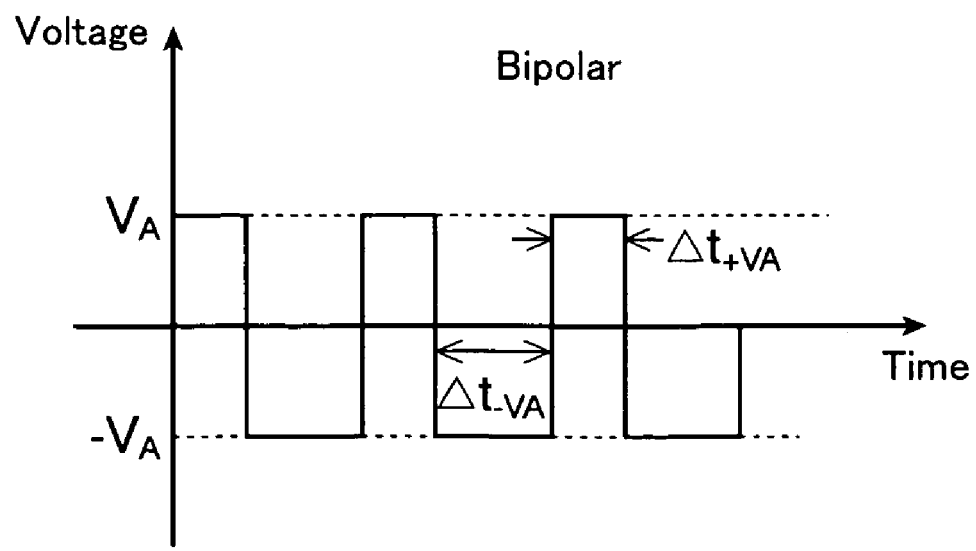
FIG. 4 is a scheme showing a bipolar square wave in the first embodiment of the present invention.

Voltage waveforms employed in this examination are illustrated in FIGS. 3 and 4.

A waveform in FIG. 3 is a unipolar square wave in which only a magnitude of the voltage is changed but its polarity is not changed. Suppose that a time period in which the voltage is a positive constant voltage $V_A$ (=1.5 V) is $\Delta t_{on}$ and a time period in which the voltage is 0 is $\Delta t_{off}$, a duty cycle of this square wave is represented by $\Delta t_{on}/(\Delta t_{on}+\Delta t_{off})$.

In contrast, a waveform in FIG. 4 is a bipolar square wave in which both a magnitude and a polarity of the voltage are changed in time. Suppose that a time period in which the voltage is the positive constant voltage $V_A$ (=1.5 V) is $\Delta t_{+VA}$ and a time period in which the voltage is the negative constant voltage $-V_A$ (=-1.5 V) is $\Delta t_{-VA}$, a duty cycle of this square wave is represented by $\Delta t_{+VA}/(\Delta t_{+VA}+\Delta t_{-VA})$.

A relationship between the voltage applied time and the leakage current was examined by applying the square waves shown in FIG. 3 and FIG. 4 between the bottom electrode 4a and the top electrode 6a of the capacitor Q. Thus, examined results shown in FIG. 5 were obtained.

Figure 5:
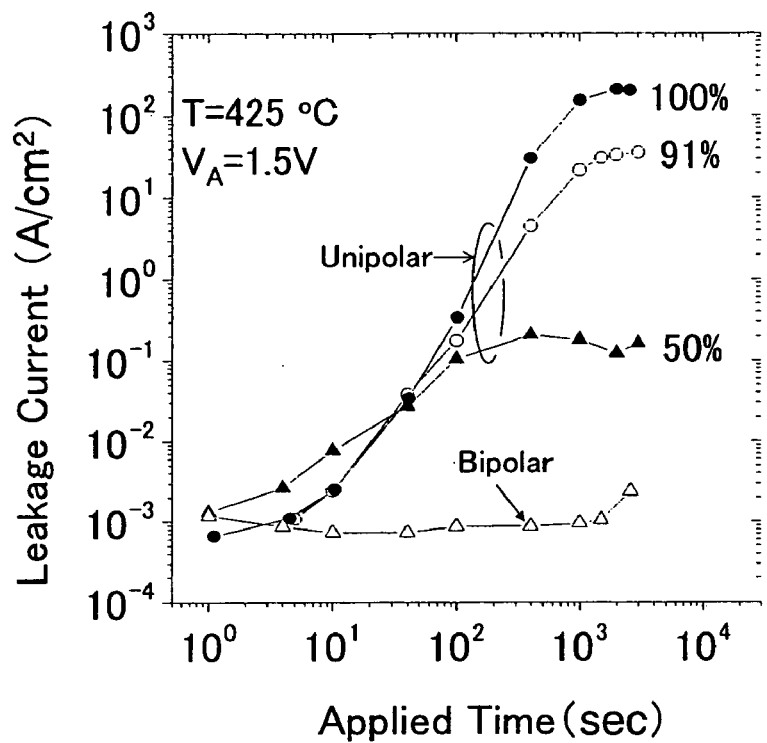
FIG. 5 is a graph showing examined results of a relationship between a voltage applied time and a leakage current in the case where the square waves shown in FIG. 3 and FIG. 4 are applied to the capacitor.

In FIG. 5, data series represented by ●, ○, ▲ indicate the case where the unipolar square wave in FIG. 3 having the time period $\Delta t_{on}$ of 1 second is applied to the capacitor Q respectively, wherein the data are given when a percentage of the duty cycle is set to 100%, 91%, and 50% respectively. In contrast, a data series represented by Δ indicates the case where the bipolar square wave in FIG. 4 having the time period $\Delta t_{+VA}$ of 1 second is applied to the capacitor Q, wherein the data are given when a percentage of the duty cycle is set to 50%.

As shown in FIG. 5, the leakage current is increased mostly with the lapse of time in the unipolar square wave whose duty cycle is 100%, which is equivalent to the DC voltage, out of four series. Thus, it is appreciated again that the DC current induces easily the resistance degradation of the capacitor dielectric film 5a.

Also, it is appreciated that, although its increasing level is lowered rather than the 100% case, the leakage current is increased with the lapse of time in the unipolar square wave whose duty cycle is 91% and 50% and also the resistance degradation is generated in the capacitor dielectric film 5a.

The inventors of this application concluded that such resistance degradation is induced by at least two causes described in the following. The first cause is an ion migration in the capacitor dielectric film 5a. It is known that the resistance degradation is induced by the ion migration in the ceramics. Then, the second cause is incoming electric charges from the electrodes 4a, 6a to the capacitor dielectric film 5a. It is considered that, when the electric charges flow into the capacitor dielectric film 5a, defective networks occur in the film and also the leakage current due to stress in the film is generated, whereby the capacitor dielectric film 5a is degraded.

In contrast, it is understood that, when the bipolar square wave whose duty cycle is 50% (Δ) is applied, the leakage current is hardly increased with the lapse of time and thus the resistance degradation is not induced in the capacitor dielectric film 5a.

The reason for this may be supposed that the bipolar voltage can suppress the above ion migration or the inflow of the electric charges into the capacitor dielectric film 5a.

It was found from the above results that, in order to prolong the lifetime of the capacitor Q by suppressing the resistance degradation of the capacitor dielectric film 5a, the bipolar voltage should be applied between the bottom electrode 4a and the top electrode 6a.

In view of above respects, the inventors of this application finally came to an electronic device that is explained as follows.

Figure 6:
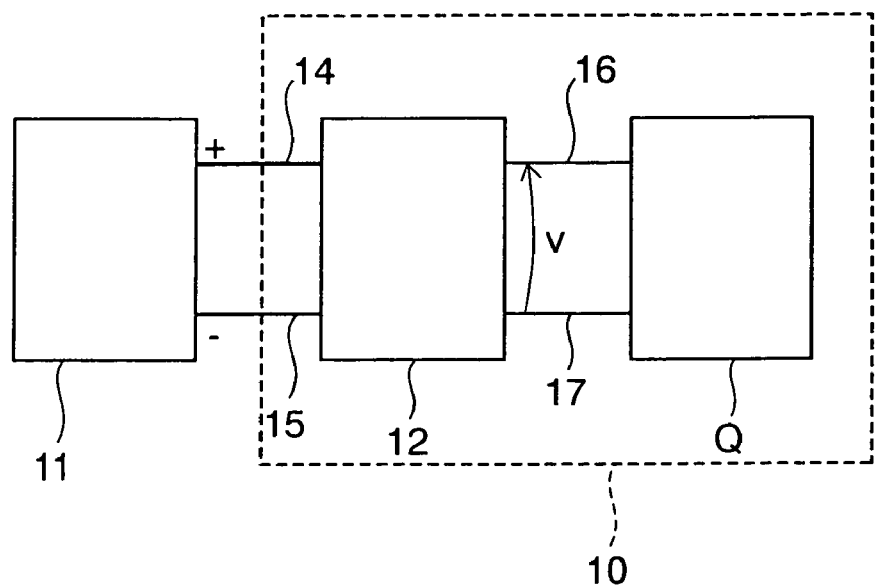
FIG. 6 is a configurative view of an electronic device according to the first embodiment of the present invention.

FIG. 6 is a configurative view of an electronic device according to the present embodiment.

This electronic device 10 has a voltage supply circuit 12 connected to a DC power supply 11, and the capacitor Q manufactured in FIG. 1E.

Out of them, the voltage supply circuit 12 is connected to first and second power-supply lines 14, 15, which are held at positive and negative constant voltages by the DC power supply 11 respectively. The bipolar square wave voltage v shown in FIG. 4 is generated based on these positive and negative constant voltages. Then, the bipolar voltage v is applied between both terminals (the bottom electrode 4a, the top electrode 6a) of the capacitor Q via first and second connection lines 16, 17. In this event, the voltage v signifies an electric potential of the other terminal (e.g., the top electrode 6a) of the capacitor Q when one terminal (e.g., the bottom electrode 4a) of the capacitor Q is used as a reference.

According to such bipolar voltage v, as explained in FIG. 5, the resistance degradation of the capacitor dielectric film 5a can be prevented and thus the enhanced lifetime of the capacitor Q can be realized.

Here, if its amplitude is too large even though the voltage v is bipolar one, it is possible that the resistance degradation is induced in the capacitor dielectric film. For this reason, it is preferable that, in order to suppress this resistance degradation, an amplitude of the voltage v, i.e., $V_A$ in FIG. 4 should be set to $5 \times 10^5$ d (V) or less (d: an interval (cm) between the top electrode 6a and the bottom electrode 4a). This is similarly true of respective embodiments described later.

Also, if an offset of the bipolar voltage, i.e., a DC component of the voltage is not 0, ions, etc. in the capacitor dielectric film are drifted in one direction that corresponds to the offset and in some cases the resistance degradation may inducted. Therefore, it is preferable that the above offset should be set to 0.

Similarly, if a time period in which the positive electric potential is applied and a time period in which the negative electric potential is applied are largely different from each other, the ions, etc. in the capacitor dielectric film are attracted to one electrode and thus it is possible that the resistance degradation is induced. Therefore, it is preferable that a percentage TD of the duty cycle of the voltage should be set to $30\% < T_D < 70\%$, more preferably 50%.

In addition, if a frequency of the voltage is excessively high, it is possible that the resistance degradation is induced. Therefore, it is preferable that the frequency of the voltage should be set as low as possible. For example, the frequency of the voltage should be set lower than 100 kHz, more preferably set lower than 10 Hz, still more preferably 1 Hz.

(2) Second Embodiment

Next, an electronic device according to a second embodiment of the present invention will be explained hereunder. In the present embodiment, the bipolar voltage discussed in the first embodiment is applied to the decoupling capacitor used together with the semiconductor element such as LSI, or the like.

Figure 7:
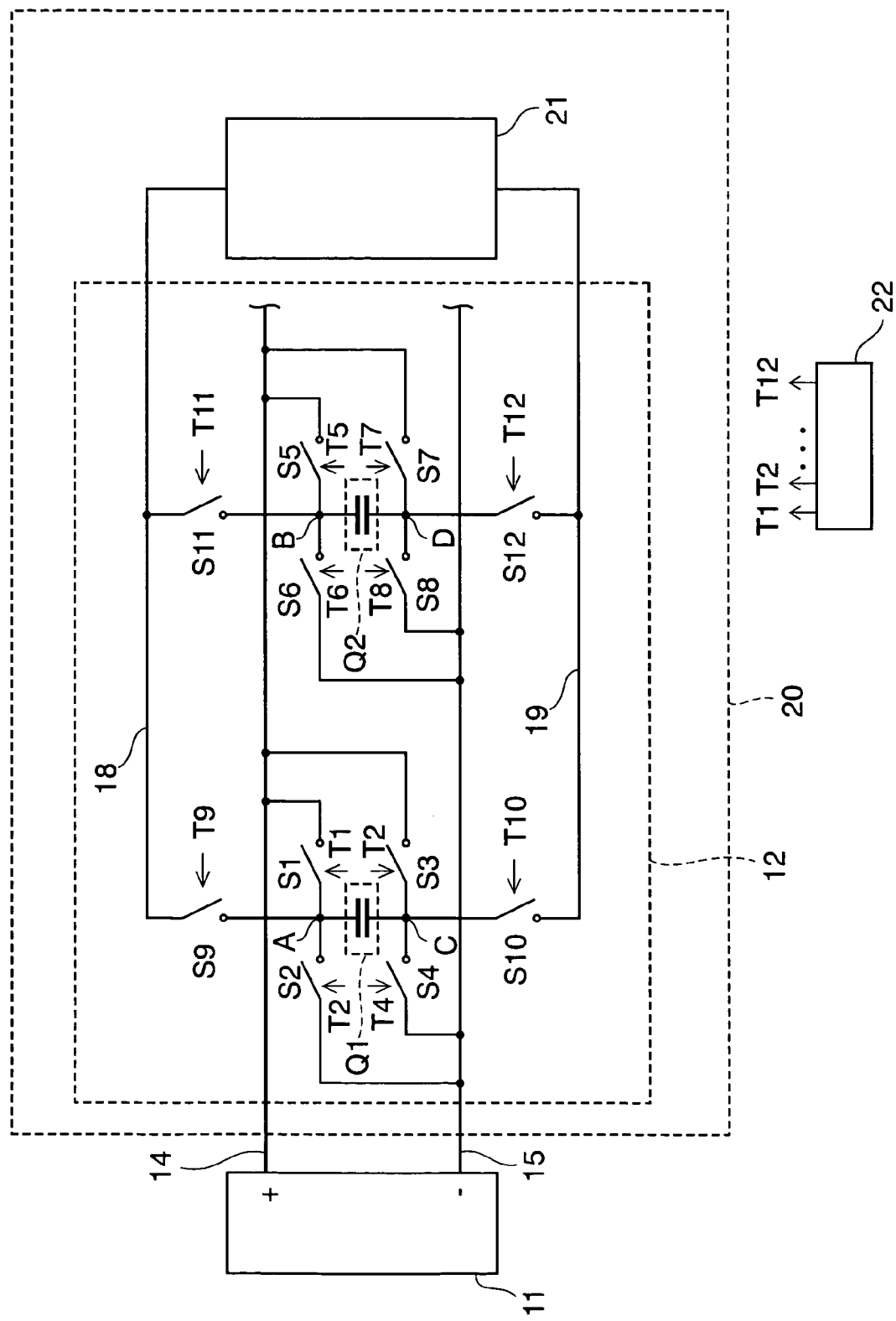
FIG. 7 is a circuit diagram of an electronic device according to a second embodiment of the present invention.

FIG. 7 is a circuit diagram of an electronic device according to the present embodiment. In FIG. 7, the same reference symbols as those in FIG. 6 are affixed to the elements that have already been explained in FIG. 6 and their explanation will be omitted hereunder.

This electronic device 20 has third and fourth power-supply lines 18, 19 held at positive and negative constant voltages respectively, the voltage supply circuit 12, first and second capacitors Q1, Q2, and a semiconductor element 21 such as LSI, or the like.

Out of them, the first and second capacitors Q1, Q2 have the sectional structure shown in FIG. 1E, for example, and serve as the decoupling capacitor that absorbs variation in the electric potential of the third and fourth power-supply lines 18, 19 connected to the semiconductor element 21. For convenience of circuit arrangement, the first and second capacitors Q1, Q2 are illustrated in the voltage supply circuit 12 in FIG. 7. However, these capacitors Q1, Q2 are not constituent elements of the voltage supply circuit 12.

Then, the positive voltage of the DC power supply is 1 V, for example, and the negative voltage of the same is 0 V, for example.

Also, the semiconductor element 21 is driven by the DC voltage supplied from the third and fourth power-supply lines 18, 19, and the type thereof is not particularly restricted.

Meanwhile, first to twelfth switches S1 to S12 are connected as shown in the voltage supply circuit 12.

Out of them, one ends of the first and second switches S1, S2 are connected to one electrode of the first capacitor Q1, and the other ends of the same are connected to the first power-supply line 14 and the second power-supply line 15 respectively. Then, one ends of the third and fourth switches S3, S4 are connected to the other electrode of the first capacitor Q1, and the other ends of the same are connected to the first power-supply line 14 and the second power-supply line 15 respectively.

Also, one ends of the fifth and sixth switches S5, S6 are connected to one electrode of the second capacitor Q2, and the other ends of the same are connected to the first power-supply line 14 and the second power-supply line 15 respectively. Then, one ends of the seventh and eighth switches S7, S8 are connected to the other electrode of the second capacitor Q2, and the other ends of the same are connected to the first power-supply line 14 and the second power-supply line 15 respectively.

In addition, the ninth and eleventh switches S9, S11 are connected between the third power-supply line 18 and a node A (connection point between the first and second switches S1, S2) and between the third power-supply line 18 and a node B (connection point between the fifth and sixth switches S5, S6) respectively.

Then, the tenth and twelfth switches S10, S12 are connected between the fourth power-supply line 19 and a node C (connection point between the third and fourth switches S3, S4) and between the fourth power-supply line 19 and a node D (connection point between the seventh and eighth switches S7, S8) respectively.

It is preferable that the MOS transistor should be used As respective switches S1 to S12. In such case, an ON state and an OFF state of the MOS transistor are controlled by signals T1 to T12 fed from a control portion 22.

According to such circuit, the first transistor Q1 and the second transistor Q2 are connected in parallel.

Figure 8:
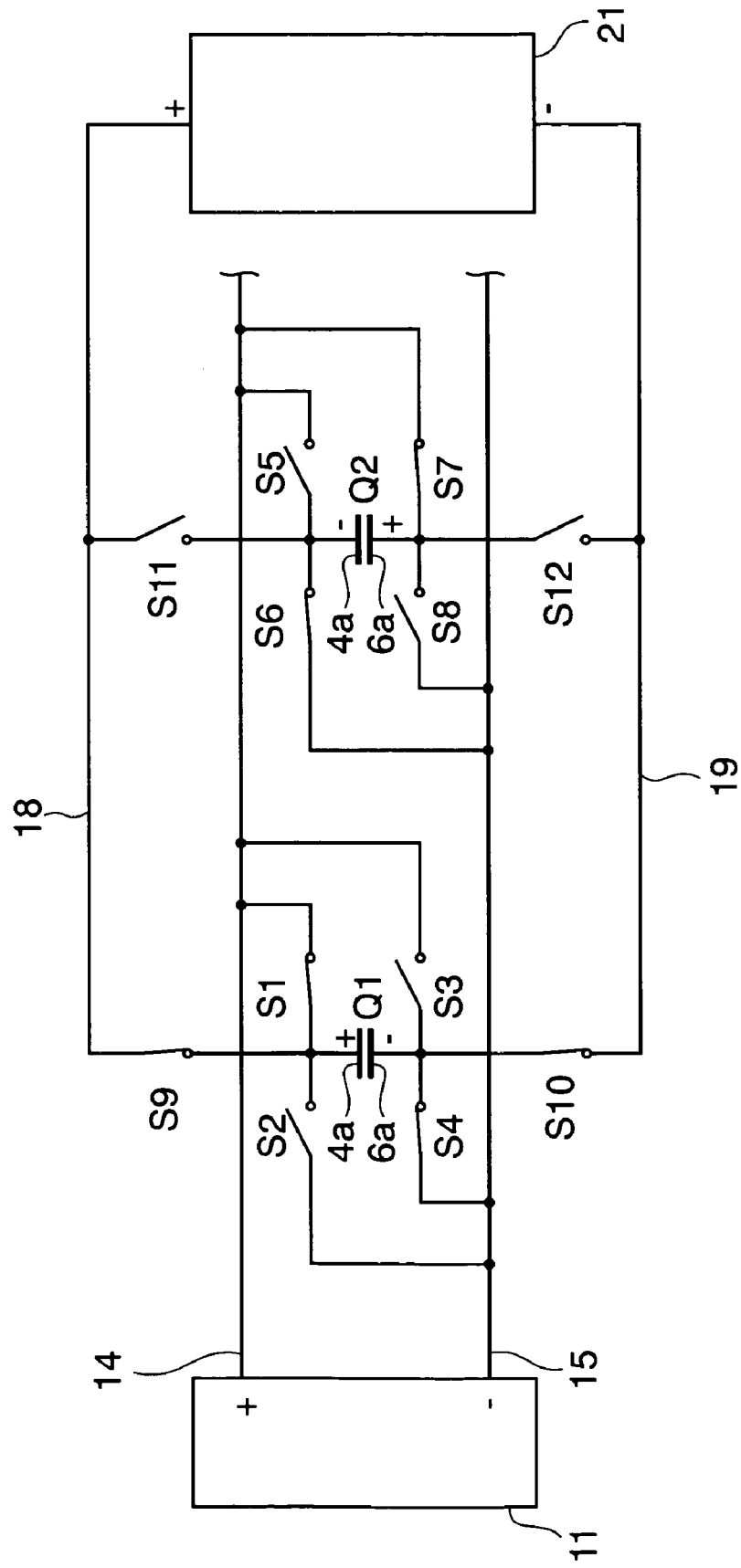
FIG. 8 is a circuit diagram of the electronic device according to the second embodiment of the present invention in its operative state.
Figure 9:
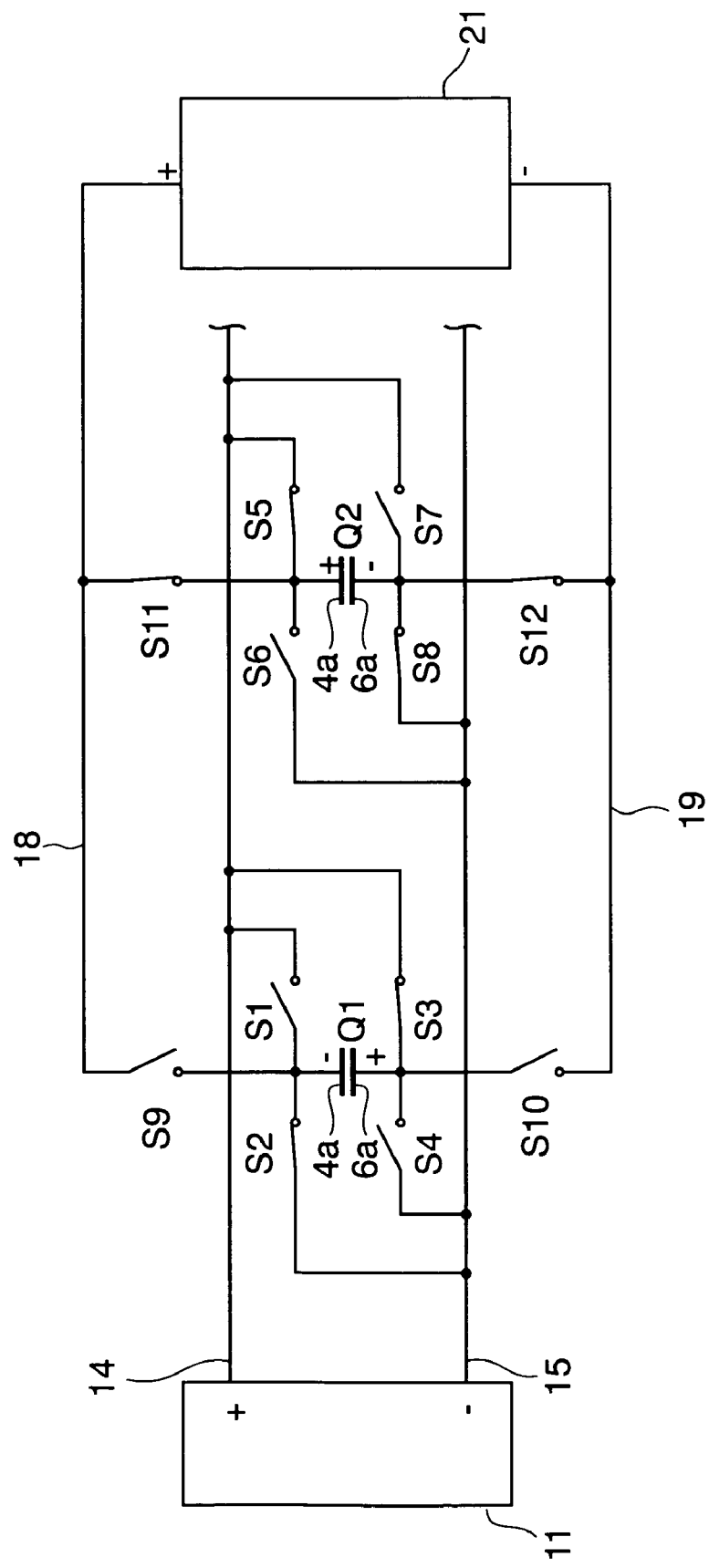
FIG. 9 is another circuit diagram of the electronic device according to the second embodiment of the present invention in its operative state.

Next, an operation of the voltage supply circuit 12 will be explained with reference to FIGS. 8 and 9 hereunder. FIGS. 8 and 9 are circuit diagrams of the voltage supply circuit 12 in operation, and polarities of respective capacitors Q1, Q2 are also given therein.

First, states of respective switches are given in FIG. 8 as follows.

switches in their ON state . . . switches S1, S4, S6, S7, S9, S10 switches in their OFF state . . . switches S2, S3, S5, S8, S11, S12

In this condition, the positive electric potential of the first power-supply line 14 is applied to one electrode 4a of the first capacitor Q1 via the switch S1, and the negative electric potential of the second power-supply line 15 is applied to the other electrode 6a of the first capacitor Q1 via the fourth switch S4.

In contrast, the negative electric potential of the second power-supply line 15 is applied to one electrode 4a of the second capacitor Q2 via the sixth switch S6. Then, the positive electric potential of the first power-supply line 14 is applied to the other electrode 6a of the second capacitor Q2 via the seventh switch S7.

Also, the third power-supply line 18 connected to the semiconductor element 21 is maintained at the positive electric potential of the first power-supply line 14 via the first and ninth switches S1, S9, while the fourth power-supply line 19 is maintained at the negative electric potential of the second power-supply line 15 via the fourth and tenth switches S4, S10.

Then, after a predetermined time, e.g., 1 second has lapsed in this state, a circuit arrangement shown in FIG. 9 is given by inverting ON/OFF of respective switches. Accordingly, states of respective switches are given as follows.

switches in their ON state . . . switches S2, S3, S5, S8, S11, S12 switches in their OFF state . . . switches S1, S4, S6, S7, S9, S10

As a result, the negative electric potential of the second power-supply line 15 is applied to one electrode 4a of the first capacitor Q1 via the second switch S2, and also the positive electric potential of the first power-supply line 14 is applied to the other electrode 5a of the first capacitor Q1 via the switch S3.

Then, the positive electric potential of the first power-supply line 14 is applied to one electrode 4a of the second capacitor Q2 via the fifth switch S5, and the negative electric potential of the second power-supply line 15 is applied to the other electrode 5a of the second capacitor Q2 via the eighth switch S8.

In this manner, in the circuit arrangement in FIG. 8, the polarities of respective capacitors Q1, Q2 are reversed in contrast to those in FIG. 9.

In contrast, the third power-supply line 18 connected to the semiconductor element 21 is still maintained at the positive electric potential of the first power-supply line 14 via the fifth and eleventh switches S5, S11, and their polarities are not reversed. Similarly, the fourth power-supply line 19 is still maintained at the negative electric potential of the second power-supply line 15 via the eighth and twelfth switches S8, S12, and their polarities are not reversed.

After this, a constant DC voltage is applied to the semiconductor element 21 from the third and fourth power-supply lines 18, 19 by repeating the above operation in a predetermined period, e.g., a period longer than $10^{-5}$ second, preferably a period longer than $10^{-1}$ second, and more preferably a period of 1 second, while reversing the polarities of the capacitors Q1, Q2.

According to the present embodiment explained as above, since the first and fourth switches S1, S4 repeat the ON state and the OFF state in synchronism and also the second and third switches S2, S3 repeat the ON state and the OFF state complementarily in synchronism with the first and fourth switches S1, S4, the voltage having the bipolar waveform is applied to the first capacitor Q1.

Therefore, as explained in the first embodiment, the resistance degradation of the capacitor dielectric film constituting the first capacitor Q1 can be suppressed. As a result, variation in the electric potential of the third and fourth power-supply lines 18, 19 that supply the DC voltage to the semiconductor element 21 can be absorbed without fail by the first capacitor Q1 and also the enhanced lifetime of the first capacitor Q1 can be attained.

Such advantages can also be attained in the second capacitor Q2.

In addition, since the ninth and tenth switches S9, S10 repeat the ON state and the OFF state in synchronism with the first and fourth switches S1, S4 and also the eleventh and twelfth switches S11, S12 repeat the ON state and the OFF state complementarily with the ninth and tenth switches S9, S10, the positive electric potential and the negative electric potential can always be applied to the third and fourth power-supply lines 18, 19.

Further, the electric potentials of the third and fourth power-supply lines 18, 19 are decided only by ON/OFF of the switches S1 to S12. Therefore, even though any one of two capacitors Q1, Q2 is destroyed, such destruction has no influence on the maintenance of the electric potential of the power-supply lines 18, 19 and also variation in the electric potential of the power-supply lines 18, 19 can be absorbed only by the remaining capacitor. As a result, since the exchange of the capacitor is not needed in the electronic device 20 even when one of the capacitors Q1, Q2 is broken, an expense due to the parts exchange can be saved and also the electronic device can be used in the environment in which the parts exchange cannot be performed.

(3) Third Embodiment

In this embodiment, a semiconductor package serving as an example of the foregoing electronic device according to the second embodiment will be explained hereunder.

FIGS. 10A to 10F are sectional views showing a semiconductor package according to a third embodiment of the present invention in the middle of manufacture. In these figures, the same reference symbols as those in the first and second embodiments are affixed to the elements that have already been explained in these embodiments and their explanation will be omitted hereunder.

Figure 10A:
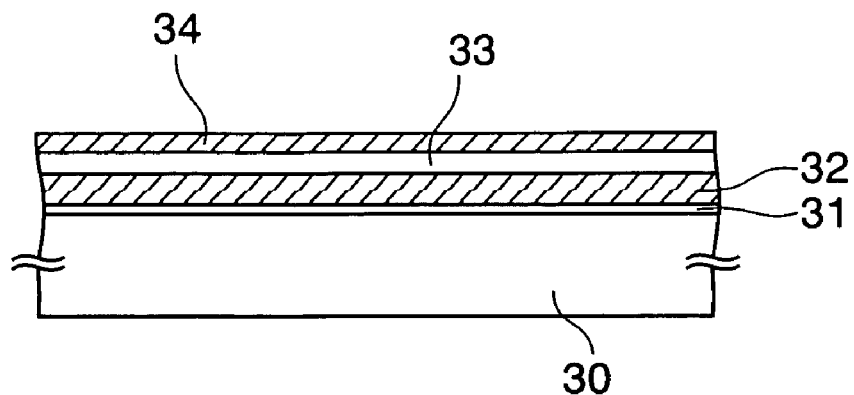
FIGS. 10A to 10F are sectional views showing a semiconductor package according to a third embodiment of the present invention in the middle of manufacture.

At first, steps required until a sectional structure shown in FIG. 10A is obtained will be explained hereunder.

First, a silicon oxide ($SiO_2$) film of about 500 nm thickness is formed as an underlying insulating film 31 on a base material 30 such as the silicon substrate, or the like by the CVD (Chemical Vapor Deposition) method using silane as a reaction gas.

Then, a Pt film of about 80 nm thickness is formed as a bottom electrode film 32 on the underlying insulating film 31 by the sputter method.

Then, a $(Ba_{0.63}Sr_{0.37})(Fe,Al)_{0.001}Y_{0.013}Ti_{0.986}O_3$ film of 100 nm thickness is formed as a dielectric film 33 on the bottom electrode film 32 by the sputter method employing the same film forming conditions as the dielectric film 5 in the first embodiment.

Then, a Pt film of about 80 nm thickness is formed as a conductive film 34 on the dielectric film 33 by the sputter method.

Figure 10B:
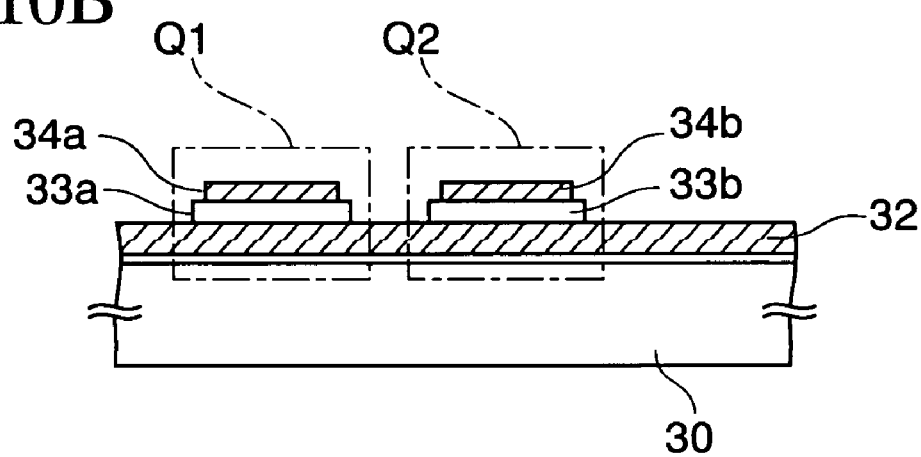

Then, as shown in FIG. 10B, island-like first and second top electrodes 34a, 34b are formed by patterning the conductive film 34 by virtue of the photolithography. Then, first and second capacitor dielectric films 33a, 33b are formed under respective top electrodes 34a, 34b by patterning the dielectric film 33 by virtue of the photolithography. Thus, the first and second capacitors Q1, Q2 constructed by the bottom electrode film 32, the first and second capacitor dielectric films 33a, 33b, and the first and second top electrodes 34a, 34b respectively are formed on the base material 30.

Figure 10C:
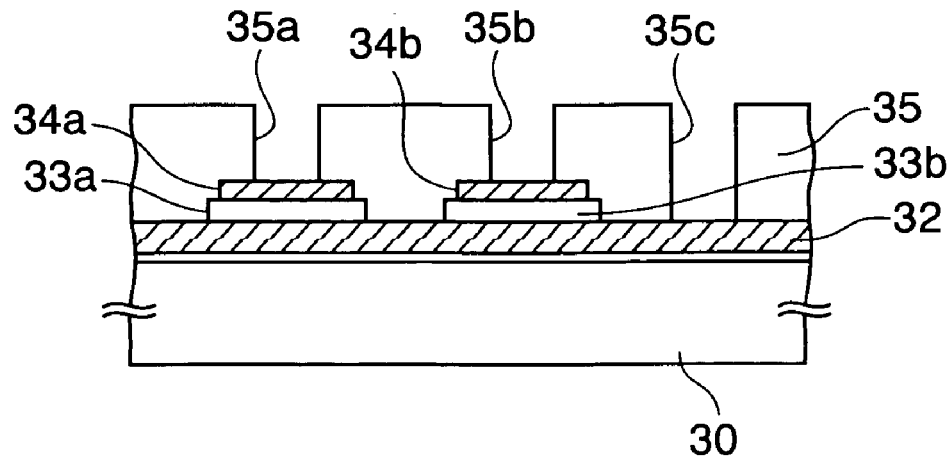

Then, as shown in FIG. 10C, an insulating protection film 35 of about 100 nm thickness is formed by spin-coating an insulating resin such as polyimide, or the like on the overall surface and then thermally curing the insulating resin. Then, the insulating protection film 35 is patterned by the photolithography. Thus, first and second holes 35a, 35b are formed to have a depth reaching the top electrodes 34a, 34b and also a third hole 35c is formed to have a depth reaching the bottom electrode film 32 in the area in which the top electrodes 34a, 34b are not formed.

Figure 10D:
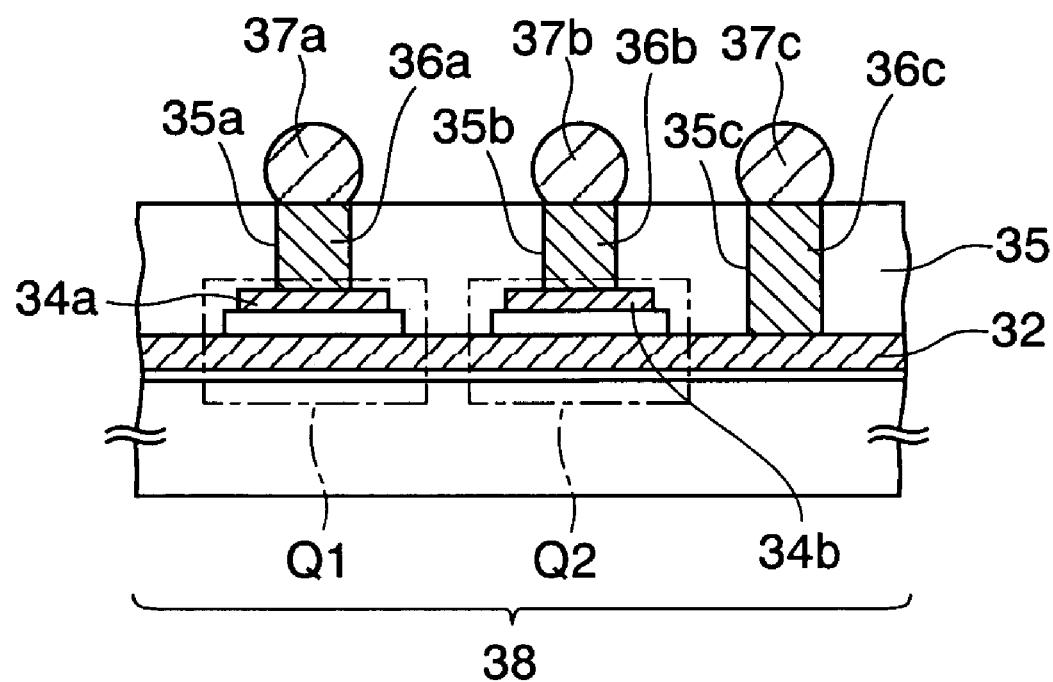

Then, as shown in FIG. 10D, for example, Ti/Cu/Ni is buried in respective holes 35a to 35c. Thus, first and second conductive plugs 36a, 36b connected electrically to the top electrodes 34a, 34b are formed in the first and second holes 35a, 35b and also a third conductive plug 36c connected electrically to the bottom electrode film 32 is formed in the third hole 35c.

Then, first to third solder bumps 37a to 37c serving as an external connection terminal are mounted on top surfaces of the conductive plugs 36a to 36c respectively. These solder bumps 37a to 37c are melted in the reflowing atmosphere, and thus connected electrically and mechanically to the conductive plugs 36a to 36c respectively.

With the above, a basic structure of a capacitor element 38 is completed.

Figure 10E:
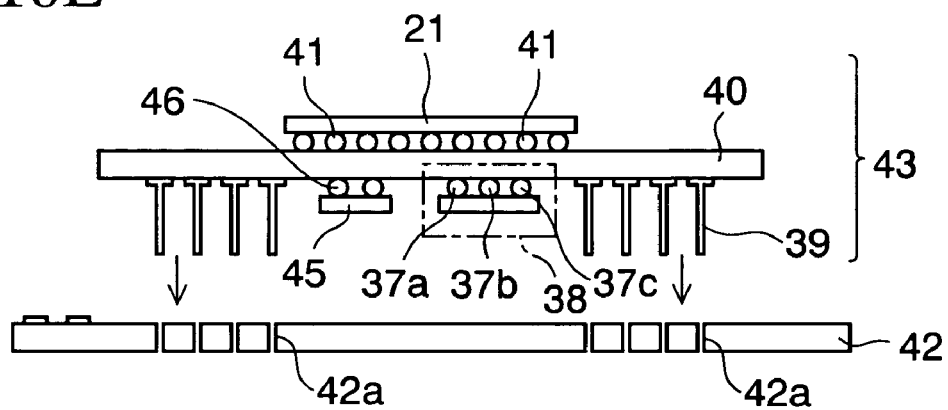

Then, as shown in FIG. 10E, in order to prevent the switching noises in the semiconductor element 21 and the variation in the power supply line, the capacitor element 38 is mounted on a wiring substrate 40 onto which the semiconductor element 21 is packaged. Then, the first and second capacitors Q1, Q2 constituting the capacitor element 38 are caused to act as the decoupling capacitor to the semiconductor element 21. Also, a power-supply semiconductor element 45 serving as the voltage supply circuit 12 explained in FIG. 7 is packaged on the wiring substrate 40.

In the example in FIG. 10E, the capacitor element 38 and the wiring substrate 40 are connected electrically and mechanically to each other via the first to third solder bumps 37a to 37c constituting the capacitor element 38. Similarly, the semiconductor element 21 is connected electrically and mechanically to the wiring substrate 40 via a solder bump 41. In addition, the power-supply semiconductor element 45 is connected electrically and mechanically to the wiring substrate 40 via a solder bump 46.

Then, a semiconductor package (electronic device) 43 is constructed by the capacitor element 38, the wiring substrate 40, the power-supply semiconductor element 45, and the semiconductor element 21. Then, a plurality of conductive pins 39 each acting as the external connection terminal of the semiconductor package 43 are provided upright to the wiring substrate 40.

Figure 10F:
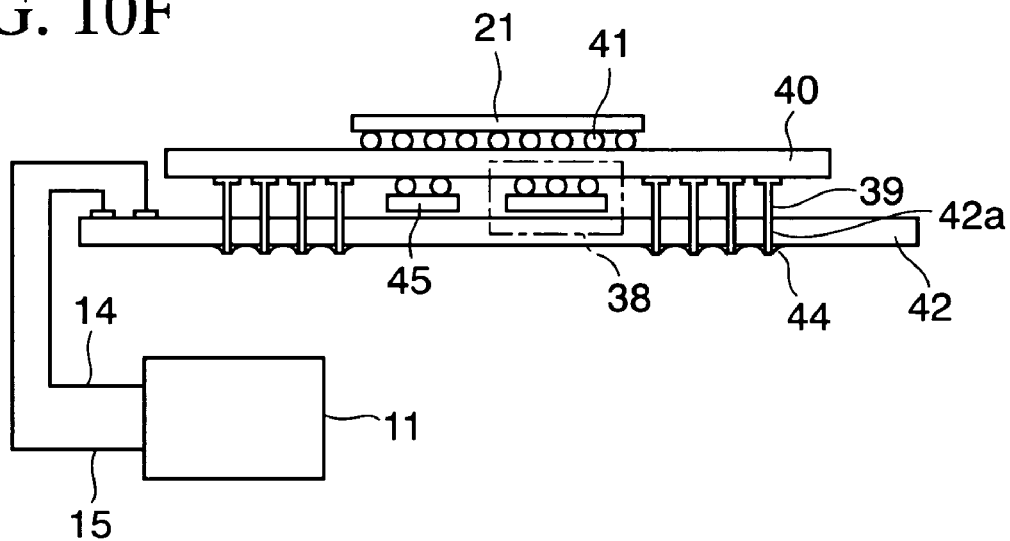

Then, as shown in FIG. 10F, the conductive pins 39 are inserted into a plurality of holes 42a formed in a motherboard 42. Then, the semiconductor package 43 is mounted on the motherboard 42 by connecting top end portions of the conductive pins 39 electrically and mechanically to the motherboard 42 via solders 44.

The DC power supply 11 explained in FIG. 7 is provided to the outside of the semiconductor package 43. A DC voltage generated from the DC power supply 11 is applied to the power-supply semiconductor element 45 via the first and second power-supply semiconductor lines 14, 15. Then, when the power-supply semiconductor element 45 executes the operation explained in FIGS. 8 and 9, the bipolar voltage explained in FIG. 4 is applied to the first and second capacitors Q1, Q2 constituting the capacitor element 38 and also the predetermined DC voltage is applied to the semiconductor element 21.

According to the present embodiment explained as above, like the second embodiment, even though one of the first and second capacitors Q1, Q2 constituting the capacitor element 38 is broken, the variation in the electric potential of the power-supply lines 18, 19 (see FIG. 7) coupled to the semiconductor element 21 can be absorbed only by the remaining capacitor that is not broken. Thus, there is no need to scrap the semiconductor package 43.

(4) Fourth Embodiment

Next, an electronic device according to a fourth embodiment of the present invention will be explained hereunder.

In the present embodiment, the waveform from the voltage supply circuit 12 and the composition of the capacitor dielectric film 5a are different from the first embodiment, but remaining portions are similar to those in the first embodiment.

Figure 11:
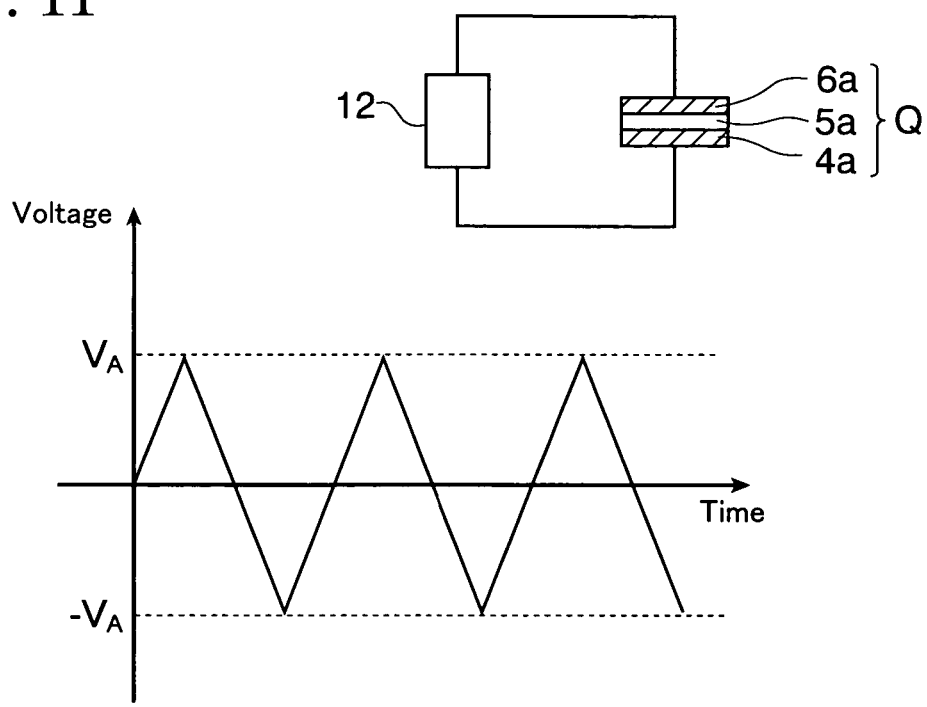
FIG. 11 is a view showing a voltage waveform (triangular wave) used in an electronic device according to a fourth embodiment of the present invention.

FIG. 11 is a view showing in parallel the bipolar voltage waveform that the voltage supply circuit 12 outputs and a sectional view of the capacitor Q to which the voltage is applied. In FIG. 11, the same reference symbols as those in the first embodiment are affixed to the elements that have already been explained in the first embodiment and their explanation will be omitted hereunder.

In the present embodiment, the capacitor dielectric film 5a constituting the capacitor Q is formed of BSTY that is obtained by doping Y (yttrium) into BST. Then, the capacitor dielectric film 5a prior to the patterning, i.e., the dielectric film 5 (see FIG. 1C) is formed by the RF sputter method to have a thickness of 100 nm. As the film forming conditions, a substrate temperature of 540° C., an RF power of 100 W, a flow rate 10:1 of Ar and $O_2$ constituting a sputter gas, and a gas pressure of 1.25 Pa are employed.

Also, the bipolar voltage being output from the voltage supply circuit 12 is a triangular wave that has no DC offset shown in FIG. 11 and, for example, its frequency is set to 1 Hz and its amplitude $V_A$ is set to 0.5 V. These parameters are one example that can be used in the present embodiment respectively, and may be optimized arbitrarily in response to the application environment of the capacitor Q.

It becomes apparent that the resistance degradation of capacitor dielectric film 5a can be prevented by such bipolar triangular wave and also the enhanced lifetime of the capacitor Q can be achieved.

(5) Fifth Embodiment

Next, an electronic device according to a fifth embodiment of the present invention will be explained hereunder.

In the present embodiment, the waveform from the voltage supply circuit 12, the film forming conditions of the BSTY film constituting the capacitor dielectric film 5a, and the composition of the top electrode 6a are different from the fourth embodiment, but remaining portions are similar to those in the fourth embodiment.

Figure 12:
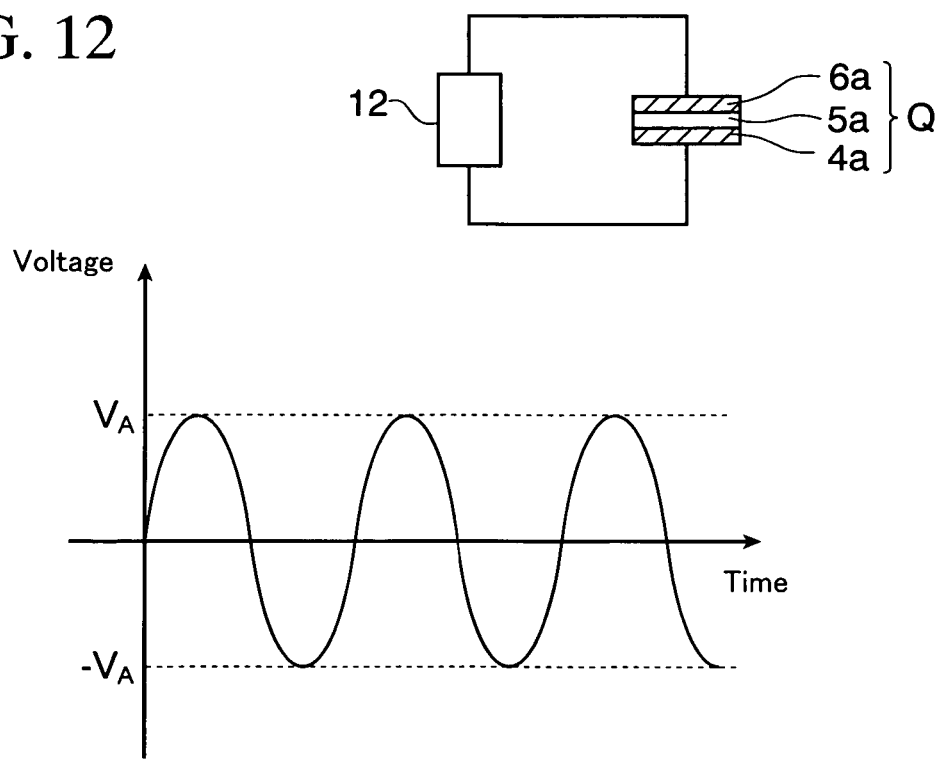
FIG. 12 is a view showing a voltage waveform (sinusoidal wave) used in an electronic device according to a fifth embodiment of the present invention.

FIG. 12 is a view showing in parallel the bipolar voltage waveform that the voltage supply circuit 12 outputs, and a sectional view of the capacitor Q to which this voltage is applied. In FIG. 12, the same reference symbols as those in the first embodiment are affixed to the elements that have already been explained in the first embodiment and their explanation will be omitted hereunder.

In the present embodiment, like the third embodiment, the capacitor dielectric film 5a of the capacitor Q is formed of BSTY, but the film forming conditions are different from the third embodiment. As the film forming conditions, in the present embodiment, a substrate temperature of 550° C., an RF power of 100 W, a flow rate 30:3.7 of Ar and $O_2$ constituting a sputter gas, and a gas pressure of 10 mTorr are employed.

Also, the bipolar voltage being output from the voltage supply circuit 12 is a sinusoidal wave that has no DC offset shown in FIG. 12 and, for example, its frequency is set to 1 Hz and its amplitude $V_A$ is set to 0.5 V. These parameters are one example that can be used in the present embodiment respectively, and may be optimized arbitrarily in response to the application environment of the capacitor Q.

It becomes apparent that the resistance degradation of capacitor dielectric film 5a can be prevented by such bipolar sinusoidal wave and also the enhanced lifetime of the capacitor Q can be achieved.

According to the present invention, the voltage with the bipolar waveform whose voltage amplitude is $5 \times 10^5$ d (V) or less (d: an interval (cm) between the top electrode and the bottom electrode) is applied to at least one of the bottom electrode and the top electrode constituting the capacitor. Therefore, the resistance degradation of the capacitor dielectric film can be prevented, and in turn the lifetime of the capacitor can be prolonged.

What is claimed is:

1. An electronic device comprising:
   a base material;
   an insulating film formed on the base material;
   a capacitor constructed by forming a bottom electrode, a capacitor dielectric film, and a top electrode sequentially on the insulating film; and
   a voltage supply circuit for supplying a voltage with a bipolar waveform to at least one of the bottom electrode and the top electrode;
   wherein an amplitude of the voltage is set to $5 \times 10^5$ d (V) or less (d: an interval (cm) between the top electrode and the bottom electrode).

2. An electronic device according to claim 1, wherein the offset of the voltage is 0.

3. An electronic device according to claim 1, wherein a frequency of the voltage is lower than 100 kHz.

4. An electronic device according to claim 1, wherein a percentage $T_D$ of a duty cycle of the voltage satisfies $30\% < T_D < 70\%$.

5. An electronic device according to claim 1, wherein the bipolar waveform is any one of a square wave, a triangular wave, and a sinusoidal wave.

6. An electronic device according to claim 1, wherein the capacitor dielectric film is formed of titanium-based $ABO_3$ perovskite type dielectric material or dielectric material with a pyrochlore structure that is represented by a general formula $A_2B_2O_7$.

7. An electronic device according to claim 6, wherein the perovskite type dielectric material is any one of $BaTiO_3$, $SrTiO_3$, $(Ba,Sr)TiO_3$, $PbTiO_3$, and $(Pb,La)(Zr,Ti)O_3$.

8. An electronic device according to claim 6, wherein the dielectric material with the pyrochlore structure is $Pb_2Ti_2O_7$.

9. An electronic device according to claim 1, wherein the insulating film is any one of a silicon oxide film, a silicon nitride film, a silicon oxide nitride film, a high-dielectric metal oxide film, and a xerogel film or a composite film formed of a combination of two or more of these films.

10. An electronic device according to claim 1, wherein the base material is a semiconductor substrate made of any one of single crystals of silicon, germanium, silicon germanium (SiGe), gallium arsenide (GaAs), indium arsenide (InAs), and indium phosphorus (InP).

11. An electronic device according to claim 1, wherein an adhesion layer is formed on the insulating film, and the bottom electrode is formed on the adhesion layer.

12. An electronic device according to claim 11, wherein the adhesion layer is formed of any one of platinum, iridium, zirconium, titanium, titanium oxide, iridium oxide, platinum oxide, zirconium oxide, titanium oxide, titanium aluminum nitride (TiAlN), tantalum nitride, and tantalum silicon nitride (TaSiN) or a single layer film or a laminated film composed of their alloys.

13. An electronic device according to claim 1, wherein the bottom electrode is formed of any one of platinum, palladium, iridium, ruthenium, rhodium, osmium, gold, silver, copper, platinum oxide, iridium oxide, and ruthenium oxide or a single layer film or a laminated film composed of their alloys.

14. An electronic device according to claim 1, wherein the top electrode is formed of any one of platinum, palladium, iridium, ruthenium, rhodium, osmium, gold, silver, copper, platinum oxide, iridium oxide, ruthenium oxide, strontium ruthenium oxide ($SrRuO_3$), and lanthanum nickel oxide ($LaNiO_3$) or a single layer film or a laminated film composed of their alloys.

15. An electronic device according to claim 1, further comprising:
a protection film for covering the capacitor.

16. An electronic device according to claim 1, wherein the voltage supply circuit includes,
a first power-supply line to which a positive voltage is applied,
a second power-supply line to which a negative voltage is applied,
a first switch connected between one electrode of the capacitor and the first power-supply line,
a second switch connected between one electrode of the capacitor and the second power-supply line,
a third switch connected between other electrode of the capacitor and the first power-supply line, and
a fourth switch connected between other electrode of the capacitor and the second power-supply line,
whereby first and fourth switches repeat an ON state and an OFF state in synchronism, and second and third switches repeat an ON state and an OFF state in synchronism complementarily with the first and fourth switches, so that the voltage having the bipolar waveform is applied to the capacitor.

17. An electronic device according to claim 16, further comprising:
another capacitor provided in addition to the capacitor;
a fifth switch connected between one electrode of another capacitor and the first power-supply line;
a sixth switch connected between one electrode of another capacitor and the second power-supply line;
a seventh switch connected between other electrode of another capacitor and the first power-supply line; and
an eighth switch connected between other electrode of another capacitor and the second power-supply line;
whereby fifth and eighth switches repeat an ON state and an OFF state in synchronism complementarily with the first and fourth switches, and sixth and seventh switches repeat an ON state and an OFF state in synchronism complementarily with the fifth and eighth switches, so that the voltage having the bipolar waveform is applied to the capacitor.

18. An electronic device according to claim 17, further comprising:
a semiconductor element;
third and fourth power-supply lines for supplying a voltage to the semiconductor element;
a ninth switch connected between the third power-supply line and a connection point of the first and the second switch;
a tenth switch connected between the fourth power-supply line and a connection point of the third and the fourth switch;
a eleventh switch connected between the third power-supply line and a connection point of the fifth and the sixth switch;
a twelfth switch connected between the fourth power-supply line and a connection point of the seventh and the eighth switch;
whereby the ninth and the tenth switches repeat an ON state and an OFF state in synchronism with the first and the fourth switches, and the eleventh and the twelfth switches repeat an ON state and an OFF state complementarily with the ninth and the tenth switches, so that the positive voltage is always applied to the third power-supply line and the negative voltage is always applied to the fourth power-supply line.

19. An electronic device according to claim 18, wherein the first to twelfth switches are formed of a MOS transistor respectively.

20. An electronic device according to claim 18, further comprising:
a control portion for controlling the first to twelfth switches.

21. An electronic device according to claim 18, wherein the two capacitors function as a decoupling capacitor to the semiconductor element.

22. An electronic device according to claim 1, wherein the capacitors are provided in parallel.

23. A method of applying a voltage to a capacitor, comprising:
applying a voltage having a bipolar waveform and an amplitude of $5 \times 10^5$ d (V) or less (d: an interval (cm) between a top electrode and a bottom electrode) to at least one of the bottom electrode and the top electrode constituting a capacitor.

24. A method of applying a voltage to a capacitor according to claim 23, wherein an offset of the voltage is 0.

25. A method of applying a voltage to a capacitor according to claim 23, wherein a frequency of the voltage is lower than 100 kHz.

26. A method of applying a voltage to a capacitor according to claim 23, wherein a percentage TD of a duty cycle of the voltage satisfies $30\% < T_D < 70\%$.

27. A method of applying a voltage to a capacitor according to claim 23, wherein the bipolar waveform is any one of a square wave, a triangular wave, and a sinusoidal wave.

* * * * *